US012693323B2

(12) United States Patent

Eskerod Madsen

(10) Patent No.: US 12,693,323 B2
(45) Date of Patent: Jul. 28, 2026

(54) SYSTEMS AND METHODS FOR DETECTING INSULATION DEFECTS IN AN UNDERGROUND POWER CABLE

(71) Applicant: REMONI A/S, Skanderborg (DK)

(72) Inventor: Bo Eskerod Madsen, Østbirk (DK)

(73) Assignee: REMONI A/S, Skanderborg (DK)

( * ) Notice: Subject to any disclaimer, the term of this patent is extended or adjusted under 35 U.S.C. 154(b) by 481 days.

(21) Appl. No.: 18/137,527

(22) Filed: Apr. 21, 2023

(65) Prior Publication Data

US 2023/0258705 A1    Aug. 17, 2023

Related U.S. Application Data

(63) Continuation of application No. PCT/DK2021/050341, filed on Nov. 23, 2021.

(30) Foreign Application Priority Data

Nov. 24, 2020    (DK) ............................ PA 2020 01322

(51) Int. Cl.
*G01R 31/08*        (2020.01)
*G01R 31/12*        (2020.01)
(Continued)

(52) U.S. Cl.
CPC ....... *G01R 31/085* (2013.01); *G01R 31/1272* (2013.01); *G01R 35/005* (2013.01); *H02G 1/00* (2013.01); *H02G 9/02* (2013.01)

(58) Field of Classification Search
CPC .... G01R 31/085; G01R 31/083; G01R 31/08; G01R 31/1272; G01R 35/005;
(Continued)

(56) References Cited

U.S. PATENT DOCUMENTS 6,777,953 B2    8/2004  Blades
6,876,203 B2    4/2005  Blades
(Continued)

FOREIGN PATENT DOCUMENTS

CN        109799434 A      5/2019
CN        110045251 A      7/2019
(Continued)

OTHER PUBLICATIONS

Mawlood, Kurdistan & Yahya, Rebaz. (2018). Using Kalman Filter and Dynamic linear models for modeling and forecasting electricity load in Erbil city. Zanco Journal of Medical Sciences. 22. 347-373. 10.21271/zjhs.22.4.21. (Year: 2018).*
(Continued)

*Primary Examiner* — Catherine T. Rastovski
*Assistant Examiner* — Eric Sebastian Von Wald
(74) *Attorney, Agent, or Firm* — Schmeiser Olsen PLLC

(57)        ABSTRACT

A system for detecting insulation defects in an underground power cable comprising one or more single conductors surrounded by an electrically conducting shield. The system comprises one or more external sensors clamped onto the outside of or arranged in the proximity of the power cable. The sensors are configured to provide two or more current measurements from the outside of the power cable without being electrically connected to any of the one or more conductors of the power cable. A signal processing unit of the system is adapted to use a mathematical statistical model that processes measurements made by the sensors to identify if the current measurements are caused by a partial discharge event from a leakage structure in the power cable.

20 Claims, 10 Drawing Sheets

(51) Int. Cl.
    *G01R 35/00*        (2006.01)
    *H02G 1/00*        (2006.01)
    *H02G 9/02*        (2006.01)

(58) Field of Classification Search
    CPC ........ G01R 15/20; G01R 31/14; G01R 15/14;
                G01R 19/0092; G01R 19/2513; G01R
                31/1245; G01R 15/18; G01R 31/12;
                G01R 31/52; G01R 31/1227; G01R
            31/42; G01R 23/20; G01R 31/00; G01R
                31/005; G01R 19/0007; H02G 1/00;
                H02G 9/02; H02G 9/06; H02J 3/00;
                                  Y04S 10/52
    See application file for complete search history.

(56)                References Cited

U.S. PATENT DOCUMENTS

| | | | |
|---|---|---|---|
| 6,882,158 | B2 | 4/2005 | Blades |
| 6,927,579 | B2 | 8/2005 | Blades |
| 7,265,533 | B2 | 9/2007 | Lightbody et al. |
| 7,863,905 | B2 | 1/2011 | Cern |
| 8,447,541 | B2 | 5/2013 | Rada et al. |
| 8,659,286 | B2 | 2/2014 | Reynolds |
| 8,664,937 | B2 | 3/2014 | Fisera |
| 8,868,359 | B2 | 10/2014 | Ganesh et al. |
| 8,970,206 | B2 | 3/2015 | Cheng et al. |
| 8,983,670 | B2 | 3/2015 | Shetty et al. |
| 9,020,769 | B2 | 4/2015 | Rada et al. |
| 9,225,389 | B2 | 12/2015 | Veronesi et al. |
| 9,310,401 | B2 | 4/2016 | Tsao et al. |
| 9,547,026 | B1 | 1/2017 | Chraim et al. |
| 9,754,329 | B2 | 9/2017 | Lin et al. |
| 9,791,477 | B2 | 10/2017 | Lorek |
| 10,187,707 | B2 | 1/2019 | Norwood et al. |
| 10,387,284 | B2 | 8/2019 | Barbis |
| 10,755,549 | B2 | 8/2020 | Pop |
| 10,761,147 | B2 | 9/2020 | Beaudet |
| 10,788,516 | B2 | 9/2020 | Hui et al. |
| 10,859,604 | B2 | 12/2020 | Lorek |
| 11,175,320 | B2 | 11/2021 | Selvaggi |
| 11,262,386 | B2 | 3/2022 | Donnal et al. |
| 11,320,467 | B1 | 5/2022 | Aljohani et al. |
| 11,358,424 | B2 | 6/2022 | Kulkarni et al. |
| 11,506,546 | B2 | 11/2022 | Blair |
| 2009/0177420 | A1 | 7/2009 | Fournier et al. |
| 2012/0278012 | A1 | 11/2012 | Ganesh et al. |
| 2012/0278013 | A1 | 11/2012 | Ganesh |
| 2013/0179099 | A1 | 7/2013 | Knijnik et al. |
| 2017/0353031 | A1* | 12/2017 | Sun ............................ H02J 3/18 |
| 2021/0080514 | A1 | 3/2021 | Beaudet et al. |
| 2021/0111561 | A1 | 4/2021 | William |
| 2022/0049977 | A1* | 2/2022 | Claytor ................. G01D 5/145 |
| 2022/0376501 | A1 | 11/2022 | Pong et al. |
| 2023/0030682 | A1 | 2/2023 | Roy et al. |
| 2024/0085468 | A1 | 3/2024 | Sepulveda Leon et al. |

FOREIGN PATENT DOCUMENTS

| | | | |
|---|---|---|---|
| CN | 113945817 | A | 1/2022 |
| EP | 2518520 | A2 | 10/2012 |
| EP | 2806277 | A1 | 11/2014 |
| EP | 2618166 | B1 | 12/2014 |
| EP | 2489987 | B1 | 9/2018 |
| EP | 1766424 | B1 | 11/2018 |
| EP | 2518520 | B1 | 3/2021 |
| EP | 3837559 | B1 | 1/2023 |
| EP | 4273563 | A1 | 11/2023 |
| EP | 4030172 | B1 | 2/2024 |
| EP | 4005047 | B1 | 5/2024 |
| JP | 2008541099 | A | 11/2008 |
| JP | 2014006229 | A | 1/2014 |
| JP | 2019211233 | A | 12/2019 |
| KR | 20180074799 | A * | 7/2018 ......... G01R 31/3191 |
| WO | 2006122415 | A1 | 11/2006 |
| WO | 2010095086 | A1 | 8/2010 |
| WO | 2016094344 | A1 | 6/2016 |
| WO | 2017144091 | A1 | 8/2017 |
| WO | 2020055662 | A1 | 3/2020 |
| WO | 2020161967 | A1 | 8/2020 |
| WO | 2021014580 | A1 | 1/2021 |
| WO | 23152424 | A1 | 8/2023 |

OTHER PUBLICATIONS

Cevallos, Holger & Intriago, Gabriel & Plaza Guingla, Douglas. (2018). The Extended Kalman Filter and the Particle Filter in the Dynamic State Estimation of Electrical Power Systems. 1-6. 10.1109/ETCM.2018.8580285. (Year: 2018).*

H. Cevallos, G. Intriago and D. Plaza, "Performance of the Estimators Weighted Least Square, Extended Kalman Filter, and the Particle Filter in the Dynamic Estimation of State Variables of Electrical Power Systems," 2018 IEEE International Conference on Automation. (Year: 2018).*

\* cited by examiner

54

6

54'

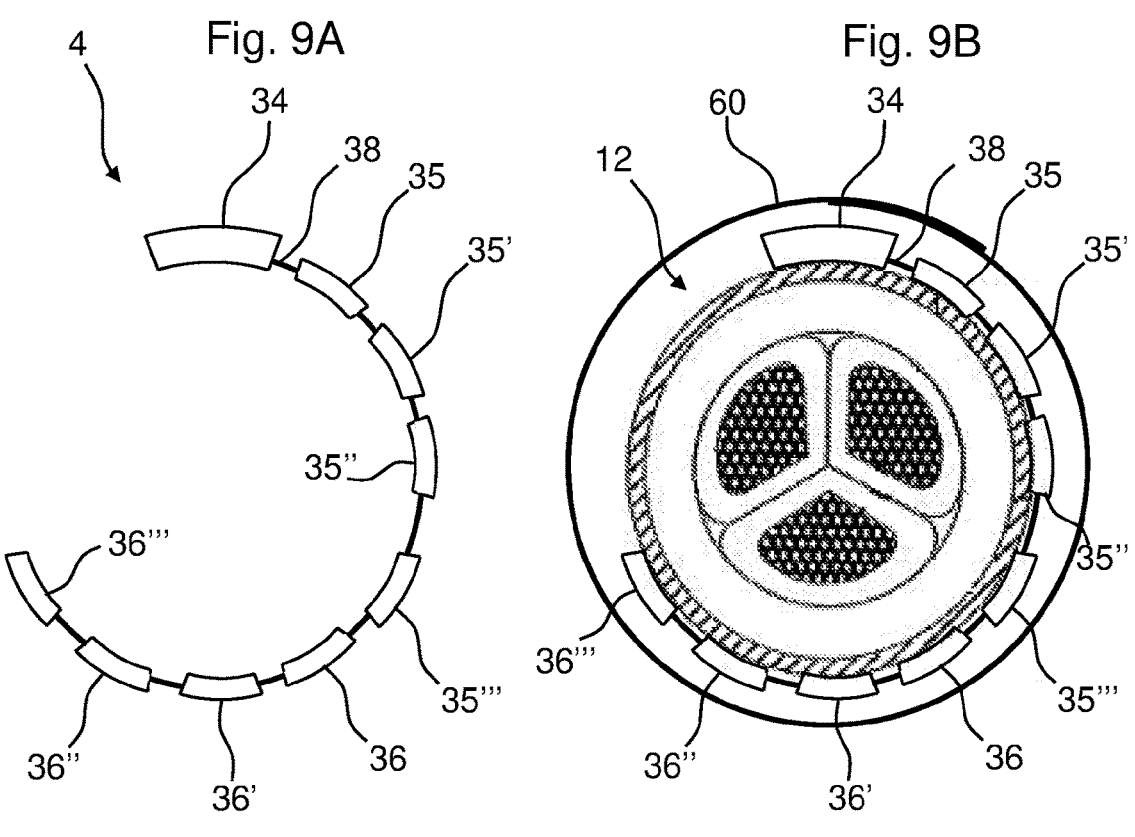
Fig. 9A
Fig. 9B
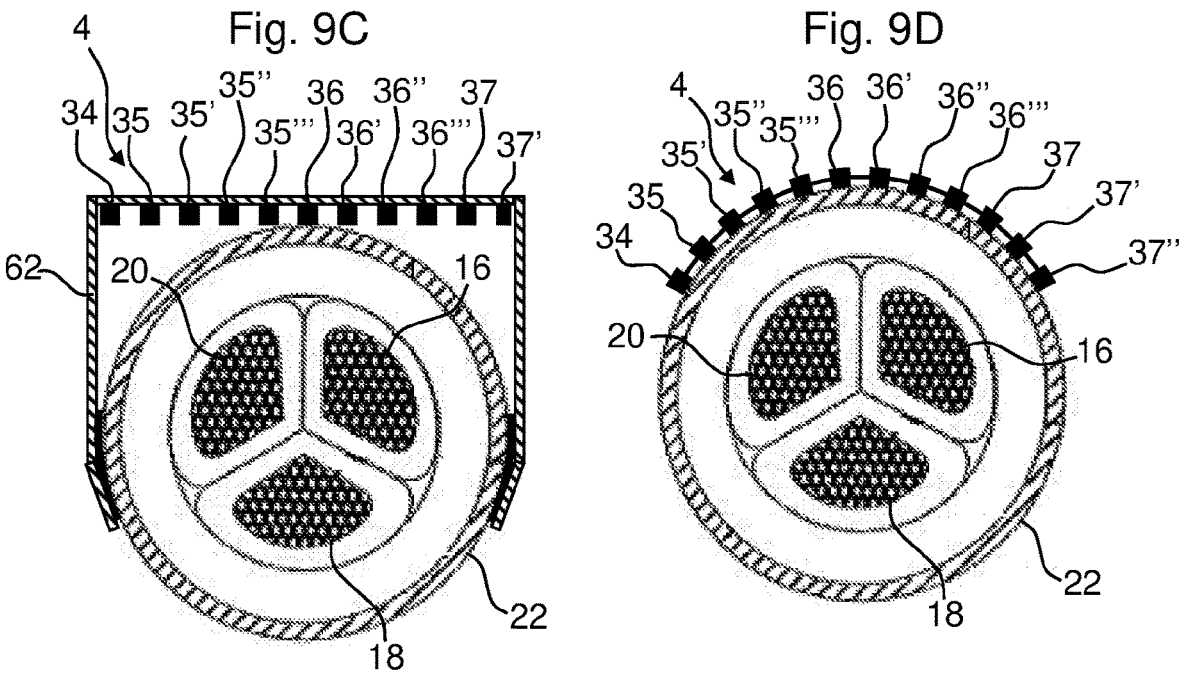
Fig. 9C
Fig. 9D

Fig. 10A
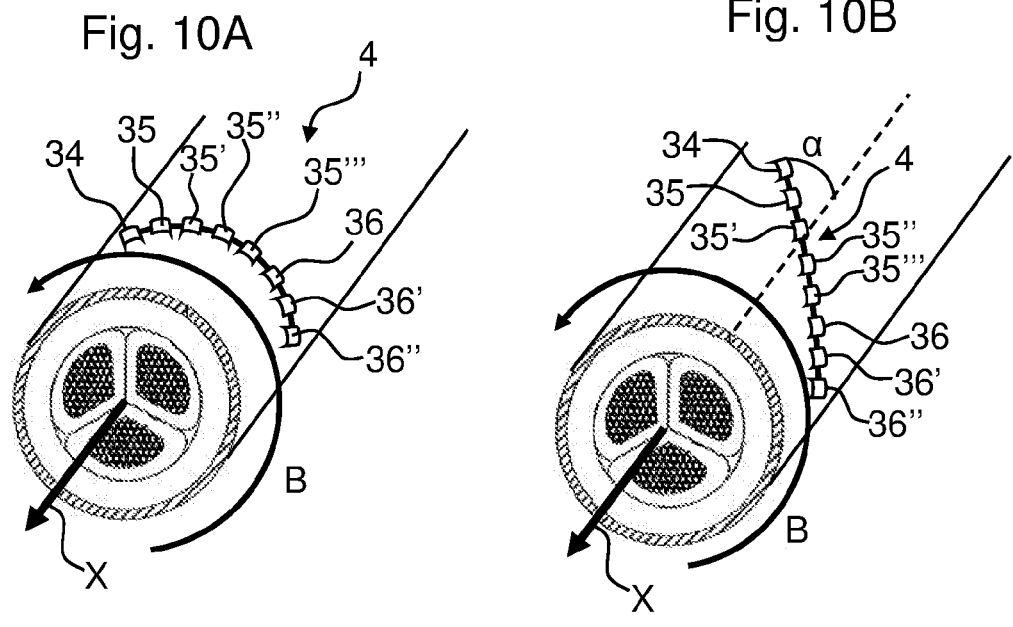
Fig. 10B
Fig. 10C
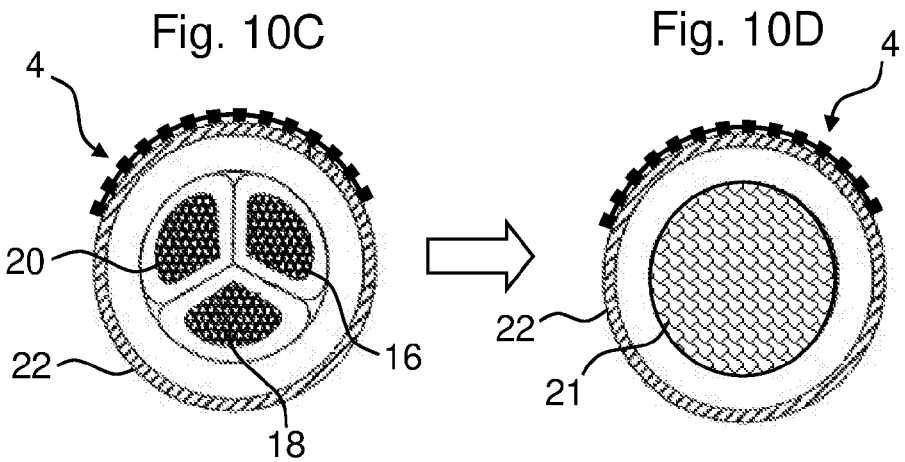
Fig. 10D

SYSTEMS AND METHODS FOR DETECTING INSULATION DEFECTS IN AN UNDERGROUND POWER CABLE

CROSS-REFERENCE TO RELATED APPLICATIONS

This application is a continuation under 35 U.S.C. 111 of International Patent Application No. PCT/DK2021/050341, filed Nov. 23, 2021, which claims the benefit of and priority to Danish Application No. PA 2020 01322, filed Nov. 24, 2020, each of which is hereby incorporated by reference in its entirety.

FIELD OF INVENTION

The present inventions relate to systems for partial discharge analysis and methods for performing partial discharge analysis. More particularly, this disclosure relates to systems and methods for detecting insulation defects in an underground power cable.

BACKGROUND

According to the international standard International Electrotechnical Commission (IEC), partial discharge is defined as: "a localized electrical discharge that only partially bridges the insulation between conductors and which can or cannot occur adjacent to a conductor".

Partial discharge occurs when an impurity or cavity inside or a protrusion outside the insulation of a conductor causes a stressed region. The stressed region may be formed by sharp edges or protrusions around the conductor.

Partial discharge in power cables includes several types of discharge phenomena such as surface discharges that appear at the boundary of different insulation materials and internal discharges that occur in voids or cavities within solid or liquid dielectrics.

The detection and measurement of discharges are based on the exchange of energy taking place during the discharge. These exchanges are manifested as electrical pulse currents.

The prior art solutions are, however, both difficult and costly to install because they need to be electrically connected to the power cable. Accordingly, when applying these solutions, it is required to break into the power cable. This has been a major unsolved challenge for decades.

The prior art partial discharge analysis tools are expensive because they require costly sensors and because these sensors are required to be installed by being electrically connected to a conductor or around a single conductor. Accordingly, these analysis tools are not suitable for widespread use.

Technical staff are more and more frequently faced with the decision whether to replace some of the older cables in their underground distribution systems. Measurement of partial discharge is used in order to identify if the cables should be replaced with new ones or repaired if possible.

Research has, however, shown that it is difficult to use measurement of partial discharge in power cables to positively identify if the power cables should be replaced. Removal of these cables based solely on partial discharge measurements may not be warranted because external events (e.g. lightning or switching in the network) as well as leakage structure in the power cable insulation can cause a partial discharge event. The problem with the prior art solutions is that they cannot tell if a partial discharge event is caused by an external event (e.g. lightning) or a leakage structure in the power cable.

US20090177420A1 discloses an apparatus for detecting, localizing and interpreting a partial discharge occurring in a partial discharge site along electrical equipment. This apparatus, however, is not suitable for determining partial discharge with sufficiently high precision.

Accordingly, it would be desirable to have systems and methods that reduce or even eliminate the disadvantages of the prior art solutions. It would be desirable to have improved apparatus and methods for detecting, localizing, and interpreting a partial discharge.

Therefore, it is an object of the present invention to provide systems which reduce or even eliminate the above-mentioned disadvantages of the prior art.

BRIEF DESCRIPTION

It is an object of the present invention to provide systems and methods for detecting, localizing, and interpreting a partial discharge in a multiconductor cable.

A system according to the present disclosure detects insulation defects in an underground power cable comprising one or more single conductors surrounded by an electrically conducting shield, wherein the system comprises one or more external clamp-on sensors clamped onto the outside of or arranged in the proximity of the power cable, wherein the clamp-on sensors are configured to provide one or more current measurements from the outside of the power cable without being electrically connected to any of the one or more conductors of the power cable, wherein the system comprises a processing unit, wherein the sensors are configured to detect a partial discharge event, wherein the system comprises a signal processing unit adapted to use a mathematical statistical model which processes measurements made by the sensors to identify if the current measurements are caused by a partial discharge event caused by a leakage structure in the power cable, wherein the mathematical statistical model is configured to make a linear projection of the current in the conductor(s) and shield, wherein the mathematical statistical model is defined as:

$$Y_t = F_t(\theta_t) + \varepsilon_t \ \varepsilon_t \sim \delta_1(V_t)$$

$$\theta_t = g_t(\theta_{t-1}) + \vartheta_t \ \vartheta_t \sim \delta_2(W_t)$$

where $Y_t$ is a vector determining the observed process at time t, comprising observed data from the sensor $(S_1, S_2, \ldots, S_n)$;
$\theta_t$ is a vector determining the latent stochastic process at time t, comprising latent process data; i.e. the currents originating from the conductor(s) and the shield of the cable, respectively;
$F_t$ is the regression matrix which determines the linear relation between the latent process and the observed process at time t;
$g_t$ is the evolve matrix which determines the transition from time t−1 to time t in the latent process;
$\delta_1$ and $\delta_2$ are the stochastic noise vectors of the observed process and the latent process respectively;
$V_t$ is the observation variance-covariance matrix; and
$W_t$ is the evolution variance-covariance matrix.

Hereby, it is possible to provide a system that is capable of measuring partial discharge in power cables in a manner that makes it possible to implement predictive and proactive maintenance; i.e. positively identify if the power cables should be replaced.

The system is configured to detect insulation defects in an underground power cable comprising a single conductor surrounded by an electrically conducting shield. Both the single conductor and the surrounding electrically conducting shield constitute a conductor. Accordingly, the single conductor surrounded by the electrically conducting shield is a two-conductor cable.

The prior art solutions are not configured to detect insulation defects in an underground power cable comprising at least a single conductor surrounded by an electrically conducting shield. The problem is that the number of equations is fewer than the number of unknowns. Accordingly, since there are an infinite number of solutions, it is not possible to provide a unique solution and thus determine whether the current measurements are caused by a partial discharge event caused by a leakage structure in the power cable or from the electrically conducting shield, using the magnetic field detected by a sensor arranged outside the power cable.

The systems and methods disclosed herein, however, apply a mathematical statistical model to identify whether the current measurements are caused by a partial discharge event caused by a leakage structure in the power cable or in the electrically conducting shield. This is done by providing a sufficiently large number of equations by arranging a sufficiently large number of sub-sensors on the outside or in the proximity of the outside surface of the power cable. Hereby, it is possible to provide a plurality of measurements detected by a number of different sensors (a main sensor and a number of sub-sensors) arranged in such a manner that the relative positions of the sensors relative to each other is known (this can be done by arranging the sensors in a predefined mounting structure).

The mathematical model is used to estimate the transfer functions from the conductors and the screen to the main sensor and the sub-sensors as a linear projection and a stochastic noise component.

If one must detect insulation defects in an underground power cable comprising three conductors (wherein the conductors are electrically insulated from one another) and an electrically conducting shield, the currents flowing in the conductors of the power cable will be denoted $I_1$, $I_2$, $I_3$ and the current flowing in the electrically conducting shield is denoted $I_4$.

The signals $B_1$, $B_2$, $B_3$, $B_4$ . . . measured by the main sensor and the sub-sensors can be calculated as a superposition of the magnetic fields generated by the currents $I_1$, $I_2$, $I_3$, $I_4$, as the superposition equations:

$$B_j = \Sigma_{i,j} d_{ij} I_i \qquad (1)$$

where $B_j$ is the $j^{th}$ signal (measured by the $j^{th}$ sensor) and $d_{ij}$ can be calculated by simple projection. The calculation can be accomplished by simple projection because the six cylinder coordinates (the three distances from the center of each of the three conductors to the sensor in question and the angular positions of the sensors) are known.

According to Ampere's law, at a distance r from the center of a conductor with a flowing current I, the magnetic field B is defined by:

$$B 2\pi r = \mu_0 I \text{ or} \qquad (2)$$

$$B = \frac{\mu_0 I}{2\pi r} \text{ where } \mu_0 \text{ is the magnetic permeability of free space.} \qquad (3)$$

Example 1

In an underground power cable having three conductors surrounded by an electrically conducting shield one will (provided that the distance from main sensor and the sub-sensors to the center of the power cable is known) have seven unknown parameters that need to be estimated using superposition equations from the main sensor and the sub-sensors.

If we have one main sensor and eleven sub-sensors, we therefore have 12−7=5 degrees of freedom. In practice, the currents take three degrees of freedom, and there are therefore two degrees of freedom in the set of 12 equations. In this specific example, the currents $I_1$, $I_2$, $I_3$, $I_4$ can therefore be estimated and differentiated by multiple linear regression with two degrees of freedom.

The number of required sub-sensors depends on the number of conductors.

In an embodiment, the main sensor and the additional sub-sensors comprise a coil. Accordingly, a current will be induced in each of the coils when a current is flowing in the conductors of the power cable or the electrically conducting shield.

In an embodiment, the system is configured to detect insulation defects in an underground power cable comprising several conductors surrounded by an electrically conducting shield.

The system comprises one or more external clamp-on sensors that are clamped onto the outside of or arranged in the proximity of the power cable. In an embodiment, the sensors may be attached to the power cable by using mechanical attachment structures. In an embodiment, the mechanical attachment structures are cable ties.

The clamp-on sensors are configured to provide one or more current measurements from the outside of the power cable without being electrically connected to any of the one or more conductors of the power cable. This is a major advantage because it makes it possible to retrofit the sensors on existing power cables both underground and above the ground.

The system comprises a signal processing unit adapted to use a mathematical statistical model which processes measurements made by the sensors to identify if the current measurements are caused by a partial discharge event caused by a leakage structure in the power cable. Accordingly, the sensors are capable of detecting a partial discharge event. The system is configured to carry out partial discharge analysis of a power cable and hereby detect an insulation defect in said power cable.

In an embodiment, the power cable comprises several single conductors.

In an embodiment, the system comprises several spaced apart sensors arranged along the shield of the power cable. Hereby, it is possible to detect the location of the leakage structure in the power cable. The more sensors, the more accurately the location of the leakage structure in the power cable can be detected. A leakage structure in the power cable will result in a partial discharge event that can be detected by sensors within a distance from the location of the leakage structure in the power cable. The sensors that are closest to the location of the leakage structure in the power cable will detect higher signals than the sensors that are arranged at a larger distance from the location of the leakage structure in the power cable. Hereby, it is possible to locate the sensors that are placed at the shortest distance from the location of the leakage structure in the power cable. Accordingly, the location of the leakage structure in the power cable can be determined.

In an embodiment, the system comprises several sensors arranged and configured to determine the location of the partial discharge event. Since the signal strength and signal frequency/wavelength of a partial discharge event depend on the distance between the sensor and the location of the event, it is possible to compare the strength of the sensor signals and hereby determine which sensor is placed at the shortest distance to the event.

In an embodiment, the system comprises a main sensor member and one or more additional sensor members arranged along the circumference of the shield of the power cable, wherein the sensor members are tangentially spaced apart.

Hereby, the sensors can detect if a partial discharge event is caused by a leakage structure without having knowledge of the internal position of the conductors of the power cable.

It is important to emphasize that the main sensor member and the one or more additional sensor members may be arranged a short distance from the shield of the power cable. In an embodiment, the main sensor member and the one or more additional sensor members are attached to the shield of the power cable. Attachment of the main sensor member and the one or more additional sensor members to the shield of the power cable may be accomplished with cable ties or other mechanical attachment structures.

In an embodiment, the system comprises a calibration unit configured to carry out a calibration of the one or more sensors in order to make the system capable of detecting if a detected signal originates from a partial discharge signal caused by a leakage structure in the power cable or by a similar signal caused by external events such as lightning or switching the grid (noise).

The calibration is carried out by applying the differences in the signal between the main sensor and the one or more additional sensors (sub-sensors) to distinguish currents running in the one or more single conductors from currents running in the surrounding shield.

In an embodiment, the calibration procedure comprises the step of carrying out training of a mathematical model, in which the difference between sensor signals detected by the different sensors is used as input. The mathematical model will after training be able to divide any signal into:

a) a first part originating from current running in the one or more single conductors; and b) a second part originating from currents running in the surrounding shield.

In an embodiment, the mathematical model is a mathematical statistical model configured to be used to estimate the part of the sensor signal that flows through the one or more single conductors and through the shield, respectively. It is possible to carry out a time-dependent transformation of the measurements of a sensor $S_1$ in order to correct for the actual environment of the sensor $S_1$.

A less computer demanding approach can be obtained by using a mathematical statistical model to estimate if a time-independent transformation can be used.

It may be an advantage to use the time-independent transformation, rather than the full mathematical statistical model, on the running measurements from the sensor $S_1$.

It may be beneficial from time to time to test if the precision of the transformation is acceptable, and update it if needed, using the mathematical statistical model.

The necessary number of samples needed can be obtained by estimating the measurement error of the transformation. In this manner, the results can be detained until the desired precision is obtained.

In the following, one method to estimate the latent stochastic process using a mathematical statistical model is described. The latent stochastic process can be modelled by e.g. a state space model defined by $$Y_t = F_t \theta_t + \varepsilon_t, \ \varepsilon_t \sim N(0, V_t) \tag{4}$$

$$\theta_t = G_t \theta_{t-1} + \vartheta_t, \ \vartheta_t \sim N(0, W_t) \tag{5}$$

where $Y_t$ is a vector determining (e.g. describing, or defining) the observed process at time t, comprising observed data from the sensor $(S_1, S_2, \ldots, S_n)$; $\theta_t$ is a vector determining the latent stochastic process at time t, comprising latent process data; i.e. the currents originating from the main conductors of the cable, the shield or from outside electromagnetic radiation, respectively; $F_t$ is the regression matrix which determines the linear relation between the latent process and the observed process at time t; $G_t$ is the evolve matrix which determines the linear transition from time t−1 to time t in the latent process; $\varepsilon_t$ and $\vartheta_t$ are zero mean multivariate Gaussian distributed noise vectors of the observed process and the latent process respectively; $V_t$ is the observation variance-covariance matrix; and $W_t$ is the evolution variance-covariance matrix.

The model parameter matrices $F_t$ and $G_t$ may be estimated by e.g. the Kalman filter, using prior data from the modelled system and/or similar systems, including the data provided by the user and/or experts in the field. Standard statistical methods can be used to conduct inference (e.g. estimate information) on the process. The information can be e.g. an estimated signal (e.g. trend) and/or forecasts (e.g. prognosis) of the process, and the related distributions of the estimates, variance and/or confidence intervals. Using these kinds of estimates, it is easy to e.g. raise warnings and/or alarms. For example, an alarm can be chosen to appear if the probability of an observed deviation in the process is less than 0.1%.

The above model framework is a special case of the more general model framework:

$$Y_t = f_t(\theta_t) + \varepsilon_t, \ \varepsilon_t \sim \delta_1(V_t) \tag{6}$$

$$\theta_t = g_t(\theta_{t-1}) + \vartheta_t, \ \vartheta_t \sim \delta_2(W_t) \tag{7}$$

Where $f_t$ and $g_t$ are general functions, $\delta_1$ and $\delta_2$ are general statistical distributions, and all other terms are as described above.

Inference on this more general model framework can be conducted by e.g. the extended Kalman filter in cases where the relation between the latent process and the observed process is non-linear, and the Kalman-Bucy filter in cases where the time is defined (e.g. described) on a continuous scale.

Other time series analysis methods and/or multivariate data-analysis methods, such as Analysis of Variance (ANOVA), Markov models, Generalized Linear Models (GLM), and Multivariate Gaussian Models may as well be used to estimate the latent stochastic process, and infer the information.

It may be an advantage to apply additional sensors because the training process hereby can be accelerated. Switching events in the one or more conductors of the power cable may be used to carry out the calibration (through the training procedure).

It is a major advantage that the sensors used in the systems and methods disclosed herein do not need to circumvent the power cable.

In an embodiment, a system comprises a calibration unit configured to carry out a calibration of the one or more sensors in order to calibrate the system to the physical placement on the cable and the environment. Hereby, it is possible to initially calibrate the sensors (during installation of the sensors).

In an embodiment, the calibration unit is separated from the sensors.

In an embodiment, the system comprises a plurality of sensors and a single centrally arranged calibration unit configured to receive and process data from the sensors.

In an embodiment, a calibration unit is integrated in each of the sensors.

In an embodiment, a calibration unit is configured to calibrate the sensor upon movement of a main sensor member and several additional sensor members of a sensor along the periphery of the power cable.

This may be accomplished by detecting several locations at which there is a local maximum sensor signal amplitude. In these positions, the main sensor member or one of the additional sensor members (sub-sensors) should be positioned. This procedure may be carried out manually or by using a calibration tool that keeps track of the location and the corresponding sensor signal.

In an embodiment, the one or more external clamp-on sensors comprise an energy harvester.

In an embodiment, the one or more external clamp-on sensors are electrically connected to an energy harvester.

In an embodiment, the energy harvester comprises a thermoelectric generator or an electric-field energy harvesting device.

In an embodiment, the system comprises:

a communication unit extending from a sensor towards ground level; and an antenna configured to transmit wireless signals, wherein the system is configured to transmit measurements made by the sensor wirelessly via the antenna.

Hereby, it is possible to detect sensor signals and transmit them wirelessly to a receiving device.

In an embodiment, the communication unit is configured to communicate wirelessly with the antenna.

In an embodiment, the system comprises a wired connection between the communication unit and the antenna.

In an embodiment, the antenna is powered by an energy harvester, such as a thermoelectric generator.

In an embodiment, the antenna is integrated in an antenna assembly that comprises an energy harvester, such as a thermoelectric generator or a solar cell.

In an embodiment, a shield structure surrounds a sensor and the entire circumference of the part of the power cable, at which the sensor extends, wherein the shield structure is an electromagnetic field shield.

In an embodiment, the shield structure is formed as a magnetic conducting shield structure configured to be arranged in a configuration in which the shield structure encloses the sensor and the entire circumference of the part of the power cable, at which the sensor extends.

Hereby, it is possible to provide electromagnetic shielding.

Hereby, it is possible to reduce the effects of electromagnetic radiation.

In an embodiment, the processing unit comprises a peak detector configured to analyze the current measurements and detect any current peaks.

In an embodiment, the processing unit comprises a high pass filter configured to high pass filter the current measurements.

In an embodiment, the processing unit comprises an algorithm configured to automatically identify if the current measurement(s) is(are) caused by a partial discharge event caused by a leakage structure in the power cable.

A method according to the disclosure is a method for detecting insulation defects in an underground power cable comprising one or more single conductors surrounded by an electrically conducting shield, wherein the method comprises the step of clamping onto the outside of or arranging in the proximity of the power cable one or more external clamp-on sensors, wherein the clamp-on sensors' power conductors are configured to provide one or more current measurements from the outside of the power cable without being electrically connected to any of the one or more conductors of the power cable, wherein the method comprises the step of applying a signal processing unit to process data, wherein the sensors are configured to detect a partial discharge event, wherein the step of applying a signal processing unit to process data is carried out by using a mathematical statistical model which processes measurements made by the sensors to identify if the current measurements are caused by a partial discharge event caused by a leakage structure in the power cable, wherein the method applies a mathematical statistical model that is used to make a linear projection of the current in the conductor(s) and shield, wherein the mathematical statistical model is defined as:

$$Y_t = F_t(\theta_t) + \varepsilon_t \; \varepsilon_t \sim \delta_1(V_t)$$

$$\theta_t = g_t(\theta_{t-1}) + \vartheta_t \; \vartheta_t \sim \delta_2(W_t)$$

where $Y_t$ is a vector determining the observed process at time t, comprising observed data from the sensor ($S_1$, $S_2$, . . . , $S_n$);

$\theta_t$ is a vector determining the latent stochastic process at time t, comprising latent process data; i.e. the currents originating from the conductor(s) and the shield of the cable, respectively;

$F_t$ is the regression matrix which determines the linear relation between the latent process and the observed process at time t;

$g_t$ is the evolve matrix which determines the transition from time t–1 to time t in the latent process;

$\delta_1$ and $\delta_2$ are the stochastic noise vectors of the observed process and the latent process respectively;

$V_t$ is the observation variance-covariance matrix; and $W_t$ is the evolution variance-covariance matrix.

Hereby, it is possible to provide a method, by which it is possible to measure partial discharge in power cables in a manner that makes it possible to positively identify if the power cables should be replaced/repaired. Accordingly, the method makes it possible to decide when power cables should be removed solely on partial discharge measurements made using the method.

In an embodiment, the power cable comprises several single conductors.

In an embodiment, a method comprises the steps of:

exposing a portion of the power cable in one or more positions along the length of the power cable;

clamping onto the outside of or arranging in the proximity of the power cable one or more external clamp-on sensors at each position; and establishing a connection between each of the external clamp-on sensors and the signal processing unit.

Accordingly, the method can be used to retrofit existing power cables with sensors allowing the method to be used to detect insulation defects in an underground power cable.

In an embodiment, the method comprises the step of calibrating the sensors.

In an embodiment, the method comprises the step of calibrating the sensors by using a calibration unit that is configured to calibrate the sensor by moving a main sensor member and several additional sensor members of a sensor along the periphery of the power cable.

By detecting several locations at which there is a local maximum sensor signal amplitude, it is possible to identify the most promising places to arrange the main sensor member and the one or more additional sensor members. Accordingly, the main sensor member or one of the additional sensor members (sub-sensors) should be positioned in these positions. This procedure may be carried out manually or by using a calibration tool that keeps track of the location and the corresponding sensor signal.

In an embodiment, each sensor comprises a main sensor member and one or more additional sensor members, wherein the method comprises the step of arranging the main sensor member and the additional sensor members along the circumference of the shield of the power cable in a manner in which the sensor members are tangentially spaced apart.

In an embodiment, the method comprises the step of applying sensors that are configured to measure both the magnetic field and the electric field of the power cable.

In an embodiment, the sensors are configured to communicate wirelessly with one or more external devices.

In an embodiment, at least some of the sensors are powered by at least one energy harvesting device.

BRIEF DESCRIPTION OF THE DRAWINGS

The systems and methods will become more fully understood from the detailed description given herein below. The accompanying drawings are given by way of illustration only, and thus, they are not limitative. In the accompanying drawings:

FIG. 9A shows a sensor according to an embodiment;

FIG. 9B shows the sensor shown in FIG. 9A attached to a power cable comprising three conductors and an electrically conducting shield;

FIG. 9C shows a sensor according to an embodiment clamped onto the outside of a power cable;

FIG. 9D shows another sensor according to an embodiment clamped onto the outside of a power cable;

FIG. 10A shows a sensor according to an embodiment arranged at the outside surface of a power cable;

FIG. 10B shows another sensor according to an embodiment arranged at the outside surface of a power cable;

FIG. 10C shows a sensor according to an embodiment arranged at the outside surface of a multiconductor power cable; and FIG. 10D shows how a method according to an embodiment can be used in a manner, in which the conductors are treated as a single conductor.

DETAILED DESCRIPTION

Figure 1:
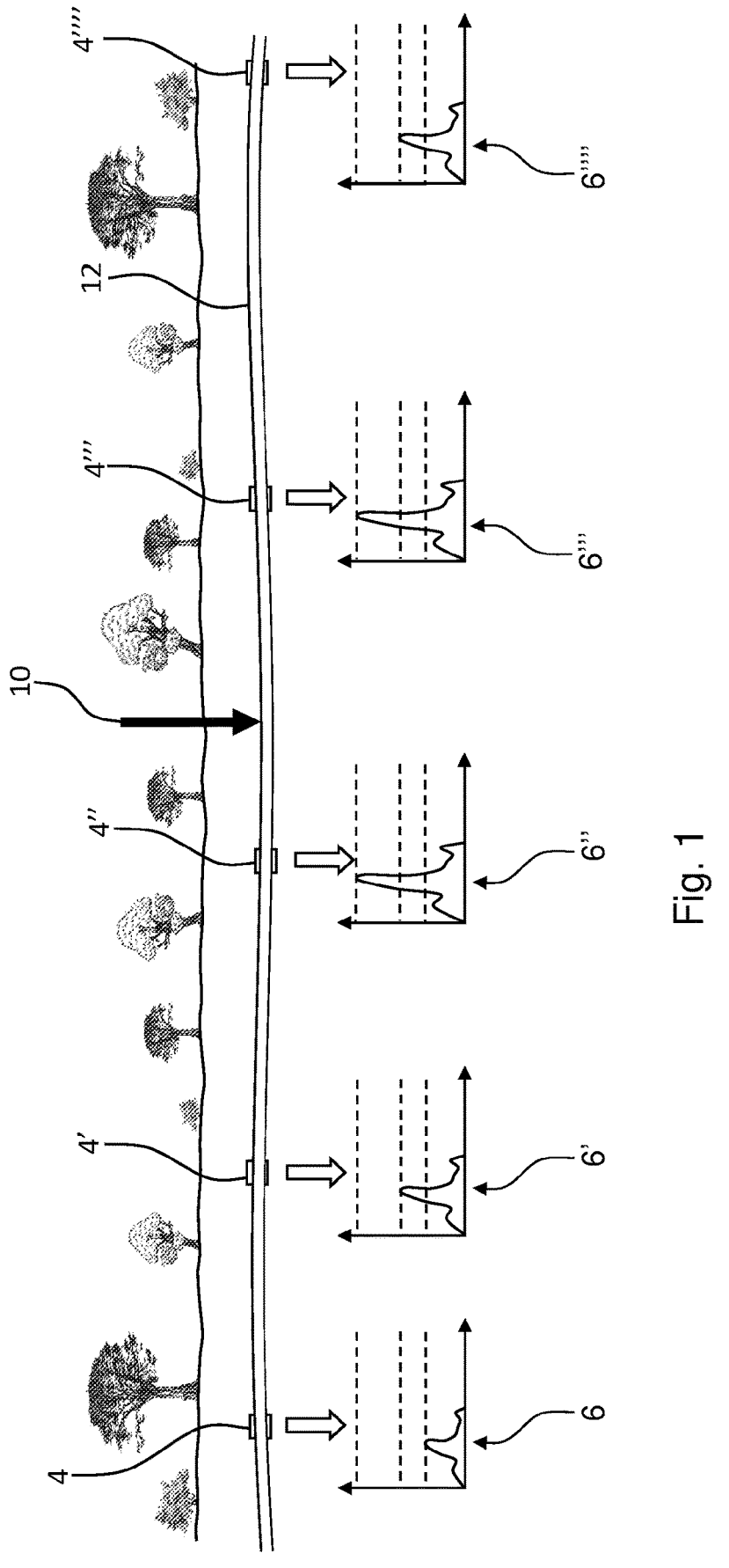
FIG. 1 shows a schematic view of a system according to an embodiment including several external clamp-on sensors clamped onto the outside of an underground power cable.

Referring now in detail to the drawings for the purpose of illustrating embodiments of the present invention, a schematic view of a system according to an embodiment is illustrated in FIG. 1. The system comprises several external clamp-on sensors 4, 4', 4", 4''', 4"" clamped onto the outside of an underground power cable 12.

The sensors 4, 4', 4", 4''', 4"" are spaced from each other. Accordingly, the sensors 4, 4', 4", 4''', 4"" will pick-up signals in different locations along the power cable 12.

Below each sensor 4, 4', 4", 4''', 4"" a detected sensor signal 6, 6', 6", 6''', 6"" that has been processed, using a signal processing unit, is plotted against time. The sensor signals 6, 6', 6", 6''', 6"" are processed in order to remove the main signal (e.g. a 50 Hz alternating current) and partial discharge events that are caused by switching events, through a processing procedure carried out using the signal processing unit. This processing procedure may include one or more filtering procedures.

The sensors 4, 4', 4", 4''', 4"" are configured to detect a current. Accordingly, the plots depict current versus time. It can be seen that the sensors 4", 4''' that are located the shortest distance to the partial discharge event 10 indicated by a bold arrow, detect a larger signal than the remaining sensors 4, 4', 4"" that are located a larger distance from the partial discharge event 10.

Therefore, it is possible to use the sensors 4, 4', 4", 4''', 4"" to identify the location of the partial discharge event 10. By comparing the amplitude of the processed sensor signals 6, 6', 6", 6''', 6"", it is possible to identify the location of the partial discharge event 10.

Figures 2A, 2B:
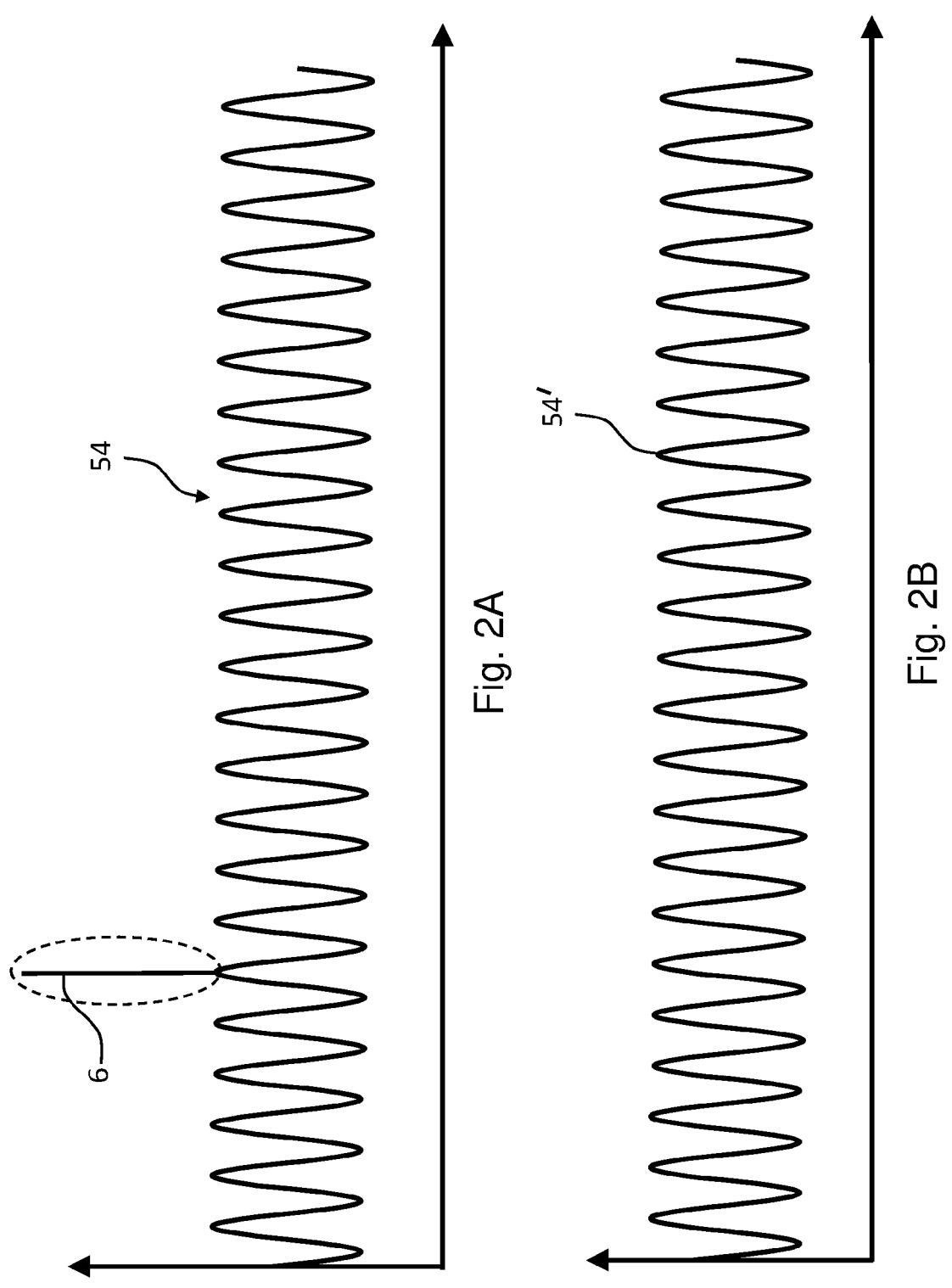
FIG. 2A shows a curve depicting a current as a function of time, wherein a partial discharge signal is shown.
FIG. 2B shows a curve depicting a current as a function of time, wherein no partial discharge signal is present.

FIG. 2A illustrates a curve 54 depicting a current as a function of time. A partial discharge signal 6 caused by a leakage structure in an underground power cable is indicated. The partial discharge signal 6 is measured by a sensor as schematically illustrated in FIG. 1. The frequency of the partial discharge signal 6 is much higher than the frequency of the "main signal" (e.g. a 50 Hz alternating current). Accordingly, the partial discharge signal 6 is shown as peak.

FIG. 2B illustrates a curve 54' depicting a current as a function of time, wherein no partial discharge signal is present. Accordingly, the curve 54' corresponds to the curve 54 in a modified version, in which the partial discharge signal 6 has been removed.

Figure 3:
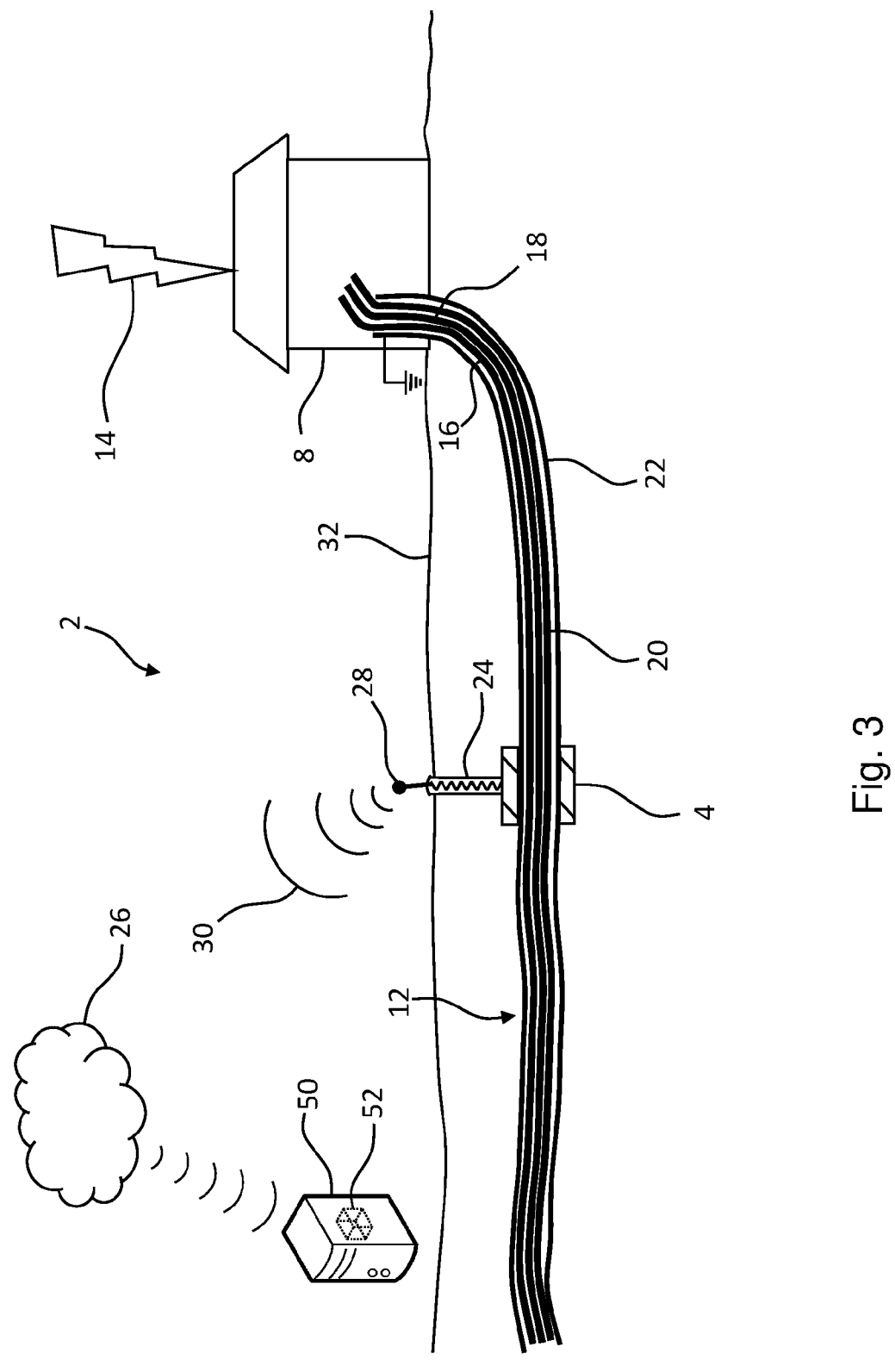
FIG. 3 shows a schematic view of a system according to an embodiment including an external clamp-on sensor that is clamped onto the outside of an underground power cable.

FIG. 3 illustrates a schematic view of a system 2 according to an embodiment. The system 2 comprises an external clamp-on sensor 4 clamped onto the outside of an underground power cable 12. The system 2 is configured to detect insulation defects in the power cable 12.

The power cable 12 comprises three conductors 16, 18, 20 surrounded by an electrically conducting shield 22. Even though it is not shown, the system 2 may comprise several external clamp-on sensors 4 that are clamped onto the outside of or arranged in the proximity of the power cable 12.

The clamp-on sensors 4 are configured to provide one or more current measurements from the outside of the power cable 12 without being electrically connected to any of the one or more conductors 16, 18, 20 of the power cable 12. The sensors 4 are configured to detect a partial discharge event. This is done by measuring the magnetic field generated by the current that runs in the conductors 16, 18, 20 and in the electrically conducting shield 22. Since each sensor 4 can only measure the superimposed magnetic field (the sum of the magnetic field caused by current that runs in the conductors 16, 18, 20 and in the electrically conducting shield 22), one has to provide additional information.

The system 2 comprises a signal processing unit 50 that is configured to provide the required additional information. The signal processing unit 50 is adapted to use a mathematical statistical model 52. The mathematical statistical model 52 is configured to process measurements made by the sensors 4 of the system 2 to identify the origin of the magnetic fields that are measured by the sensors 4. This means that the signal processing unit 50 can split the measured signal up into:

a) a current running in the conductors 16, 18, 20; and b) a current running in the shield 22.

Accordingly, the signal processing unit 50 is capable of identifying if the current measurements are caused by a partial discharge event caused by a leakage structure in the power cable 12.

The power cable is connected to a connection assembly arranged in a power station 8. It can be seen that the shield 22 is grounded. A lightning bolt 14 hits the power station 8 and this causes a partial discharge event. Accordingly, a partial discharge event current runs in the conductors 16, 18, 20. Since the shield 22 is electrically conducting and surrounds the conductors 16, 18, 20, a current is induced in the shield 22. Due to the capacitive coupling between the conductors 16, 18, 20 and the surrounding shield 22, however, the induced current caused by the partial discharge event current (caused by the lightning) will be delayed by 90 degrees (or a fourth of a wavelength). Accordingly, by comparing the partial discharge event current in the shield 22, and the partial discharge event current in the conductors 16, 18, 20, it is possible to identify if the partial discharge event current is caused by a leakage structure in the power cable 12.

The system 2 is capable of detecting if the current measurements are caused by a partial discharge event caused by a leakage structure in the power cable 12.

The system comprises an antenna 28 and a communication unit 24 arranged to transfer the signals detected by the sensor 4 to the antenna 28. The communication unit 24 may be configured to transfer the signals via a wired connection or via a wireless connection to the antenna 28.

The antenna 28 transmits wireless signals 30 that are received by the signal processing unit 50. The wireless signals 30 are sent via the Internet 26.

In an embodiment, the sensor 4 and/or the communication unit 24 comprises or is electrically connected to an energy harvester that is arranged and configured to harvest energy and hereby supply the sensor 4 and/or the communication unit 24 with electric energy. In an embodiment, the energy harvester comprises a thermoelectric generator or an electric-field energy harvesting device. In an embodiment, the energy harvester comprises a solar panel.

Figures 4A, 4B, 4C:
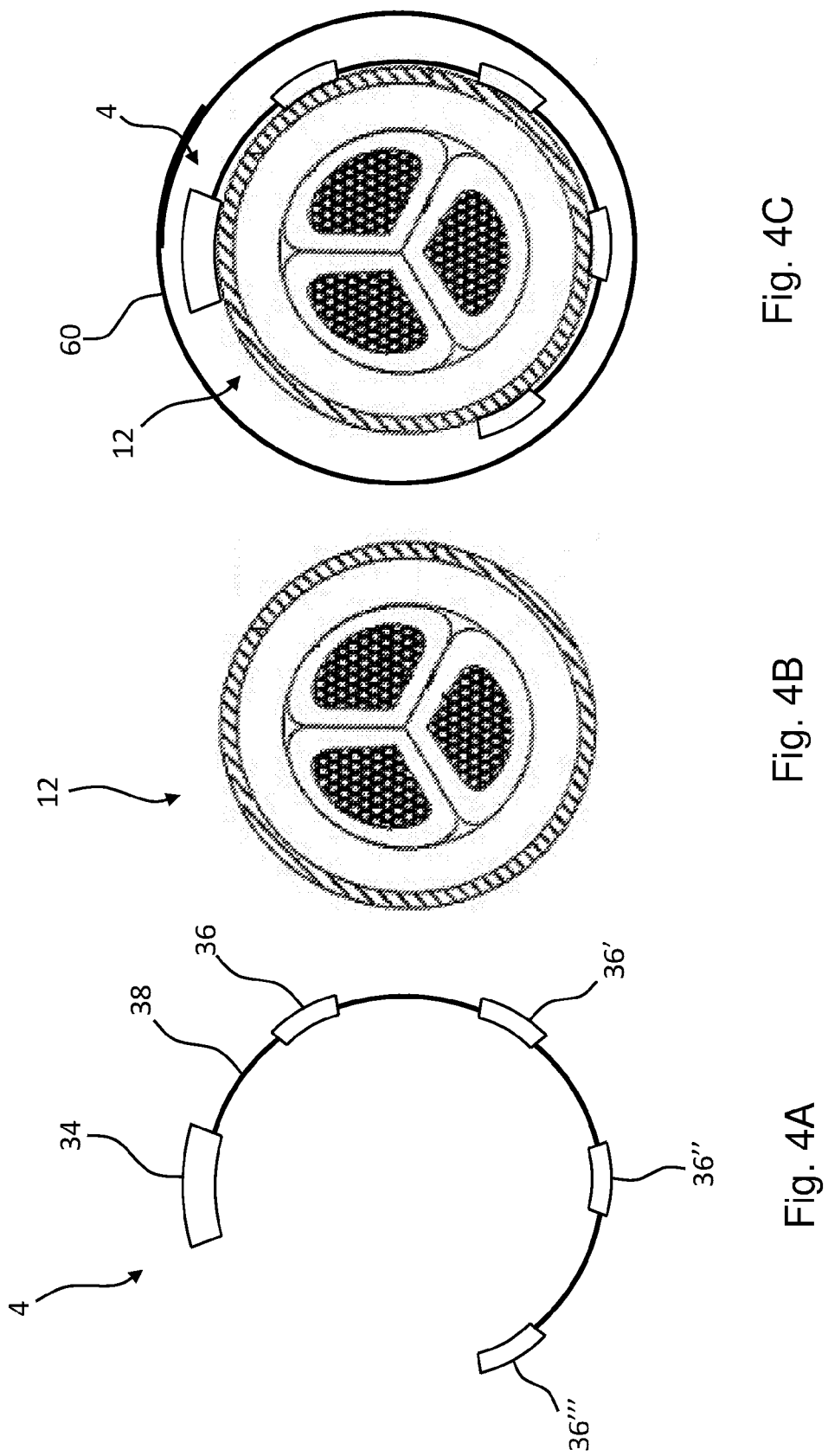
FIG. 4A shows a sensor according to an embodiment.
FIG. 4B shows a power cable.
FIG. 4C shows the sensor shown in FIG. 4A attached to the power cable shown in FIG. 4B.

FIG. 4A illustrates a sensor 4 according to an embodiment. The sensor 4 comprises a main sensor member 34 and several additional sensor members (sub-sensors) 36, 36', 36", 36'''. The main sensor member 34 is electrically connected to the additional sensor members 36, 36', 36", 36''' by an electrical connector 38.

The main sensor member 34 and each of the additional sensor members 36, 36', 36", 36''' are configured to detect a magnetic field caused by a current running in an underlying structure. By having several sensor members 34, 36, 36', 36", 36''', it is possible to arrange the sensor members 34, 36, 36', 36", 36''' in different tangential positions around a power cable 12 as shown in FIG. 4C. Hereby, it is possible to process the data from the sensor members 34, 36, 36', 36", 36'''(e.g. using a signal processing unit 50 such as the one explained with reference to FIG. 3) in order to be able to separate the measured signal into a current running in the one or more conductors of the power cable and a current running in the shield of the power cable.

In an embodiment, the main sensor member 34 comprises an integrated communication unit (not shown). In an embodiment, the main sensor member 34 is configured to receive signals from the additional sensor members 36, 36', 36", 36''' and to transmit the signals measured by the main sensor member 34 as well as signals from the additional sensor members 36, 36', 36", 36''' to a receiving device either through a wired connection or through a wireless connection.

FIG. 4B illustrates a power cable 12 according to an embodiment. The power cable 12 corresponds to the type of power cable 12 shown and explained with reference to FIG. 5A.

FIG. 4C illustrates the sensor 4 shown in FIG. 4A attached to the power cable 12 shown in FIG. 4B. It is possible to use any suitable attachment structures to attach the sensor 4 to the power cable 12. In an embodiment, the sensor 4 is attached to the power cable 12 by one or more cable ties (not shown). A shield structure 60 surrounds the sensor 4 and the entire circumference of the part of the power cable 12 at which the sensor 4 extends. The shield structure 60 is an electric-field shield.

The shield structure 60 is applied to isolate the sensor 4 and the power cable 12 electrically from the environment through which the cable 12 runs. In an embodiment, the shield structure 60 is a conductive enclosure used to block electrostatic fields.

Figure 5B:
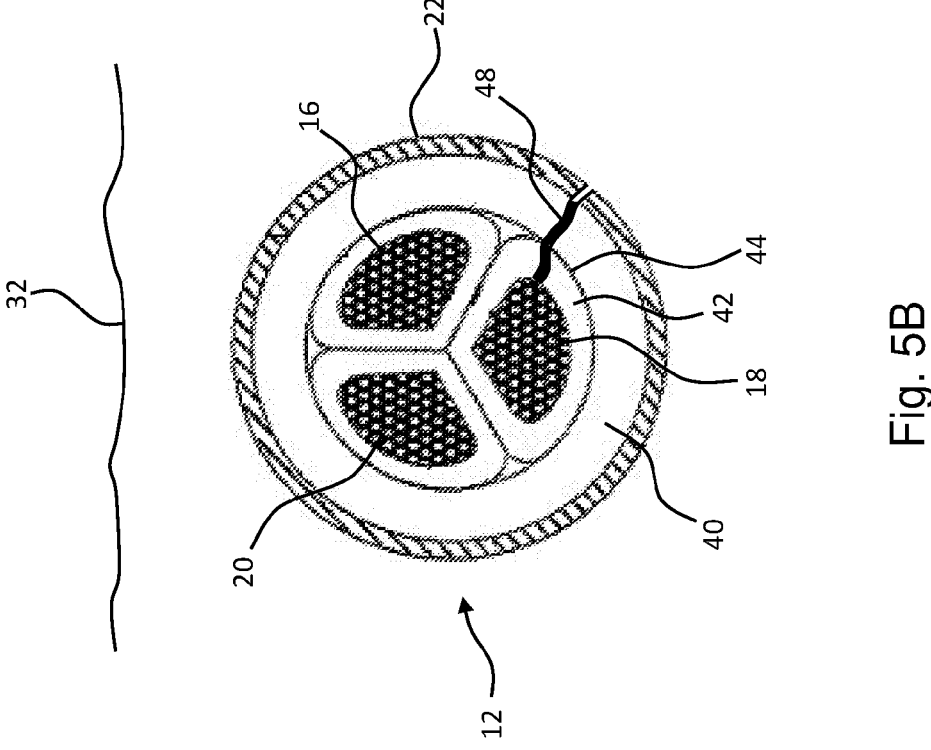
FIG. 5B shows the power cable shown in FIG. 5A, wherein the leakage structure has been replaced by a fused region.
Figure 5A:
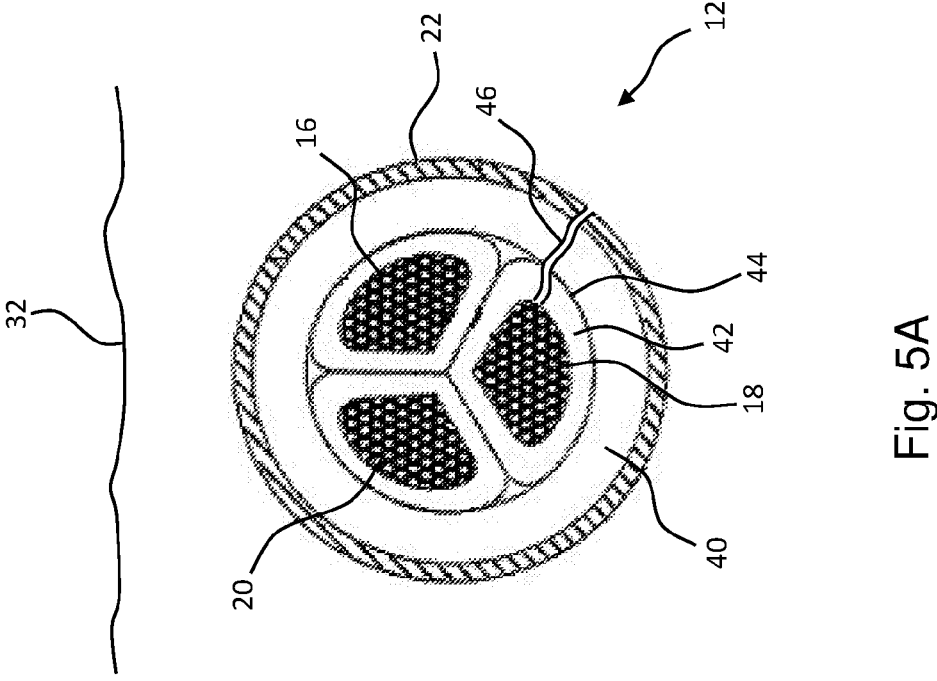
FIG. 5A shows a power cable comprising a leakage structure.

FIG. 5A illustrates an underground power cable 12 arranged below ground level 32. The power cable 12 comprises three single conductors 16, 18, 20. Each of the three single conductors 16, 18, 20 is surrounded by insulation 42. The insulation 42 of the three conductors 16, 18, 20 is surrounded by an insulation structure 44. The insulation structure 44 is surrounded by a filler 40. The filler 40 is surrounded by a metal lead shield 22.

It can be seen that the power cable 12 is damaged and comprises a leakage structure 46 (enlarged for illustration). The leakage structure 46 extends through the shield 22. Accordingly, water and moisture may enter the cable 12 through the leakage structure 46. The leakage structure 46 extends through the filler 40, the insulation structure 44 and the insulation 42. Accordingly, when water or moisture enters the leakage structure 46 the electrical impedance along the path of the leakage structure 46 is decreased to such an extent that a short circuit (an electrical current that travels along the unintended path of the leakage structure 46) is created.

During the short circuit, current flow is maximum and accordingly the temperature within the leakage structure 46 rises. Therefore, the short circuit will typically cause melting of the leakage structure 46 so that a fused region 48 is generated as shown in FIG. 5B. The fused region 48 might at least for a while seal the damaged structure (the leakage structure 46) of the power cable. Therefore, one may experience several short circuits as the one explained with reference to FIG. 5A before the power cable 12 must be replaced.

Figures 6A, 6B, 6C:
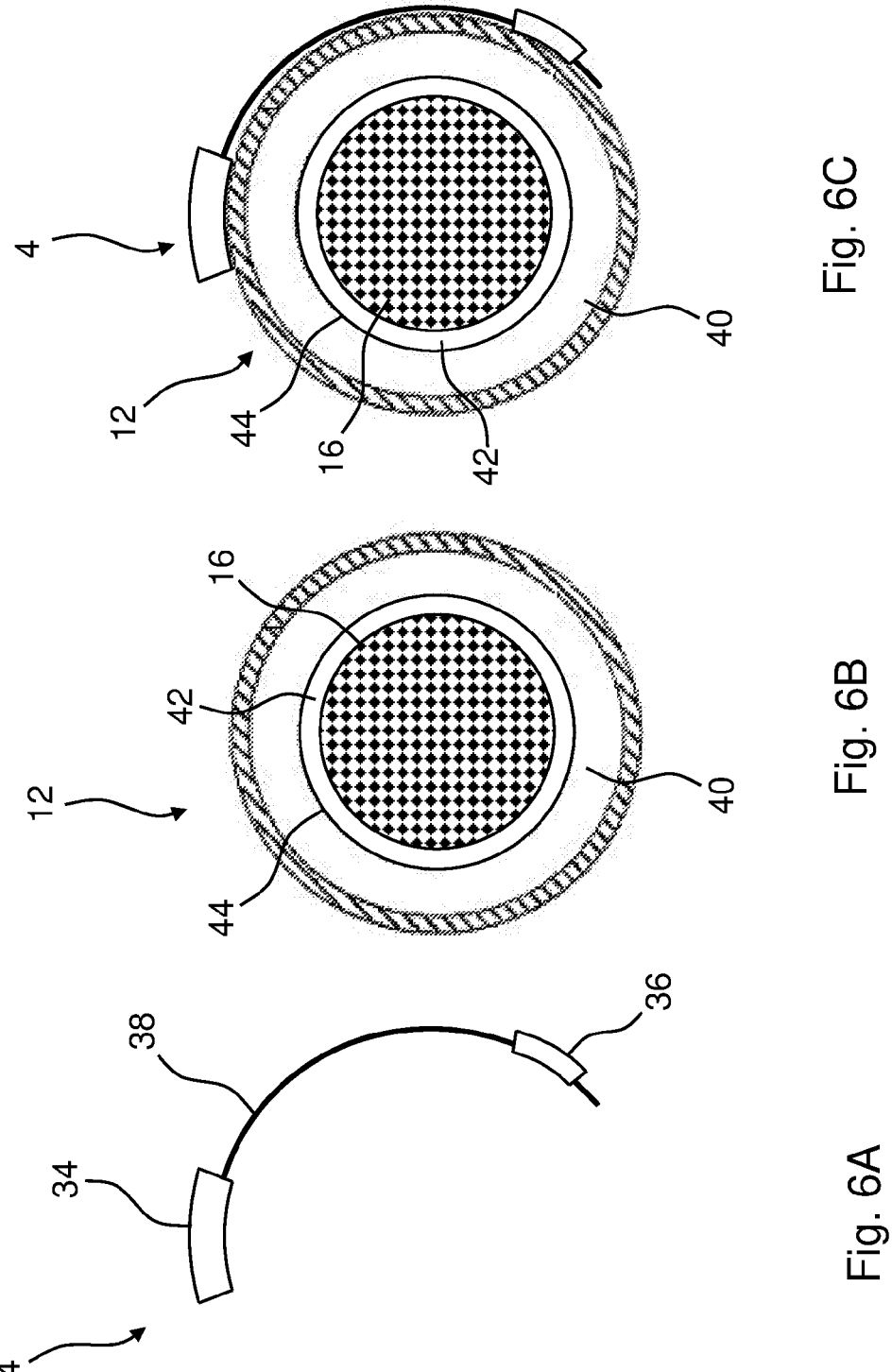
FIG. 6A shows a sensor according to an embodiment.
FIG. 6B shows a power cable.
FIG. 6C shows the sensor shown in FIG. 6A attached to the power cable.

FIG. 6A illustrates a sensor 4 according to an embodiment. The sensor 4 comprises a main sensor member 34 and a single additional sensor member (sub-sensor) 36. The main sensor member 34 is electrically connected to the additional sensor member 36 via an electrical connector 38.

The main sensor member 34 and the additional sensor member(s) 36 are configured to detect a magnetic field caused by a current running in an underlying structure. By having several sensor members 34, 36, it is possible to arrange the sensor members 34, 36 in different tangential positions around a power cable 12 as shown in FIG. 4C. Hereby, it is possible to process the data from the sensor members 34, 36 (e.g. using a signal processing unit 50 such as the one explained with reference to FIG. 3) and separate the measured signal into a current running in the one or more conductors of a power cable and a current running in the shield of a power cable.

In an embodiment, the main sensor member 34 comprises an integrated communication unit (not shown). In an embodiment, the main sensor member 34 is configured to receive signals from the additional sensor member 36 and to transmit the signals measured by the main sensor member 34 as well as signals from the additional sensor member 36 to a receiving device either through a wired connection or through a wireless connection.

FIG. 6B illustrates a power cable 12 according to an embodiment The power cable 12 comprises a single conductor 16 that is surrounded by an insulator 42. The insulator 42 is surrounded by an insulation structure 44. A filler 40 is provided between the insulation structure 44 and a surrounding metallic lead shield 22.

FIG. 6C illustrates the sensor 4 shown in FIG. 6A attached to the power cable 12 shown in FIG. 6B. It is possible to use any suitable attachment structures to attach the sensor 4 to the power cable 12. In an embodiment, the sensor 4 is attached to the power cable 12 by one or more cable ties (not shown).

Figures 7A, 7B, 7C:
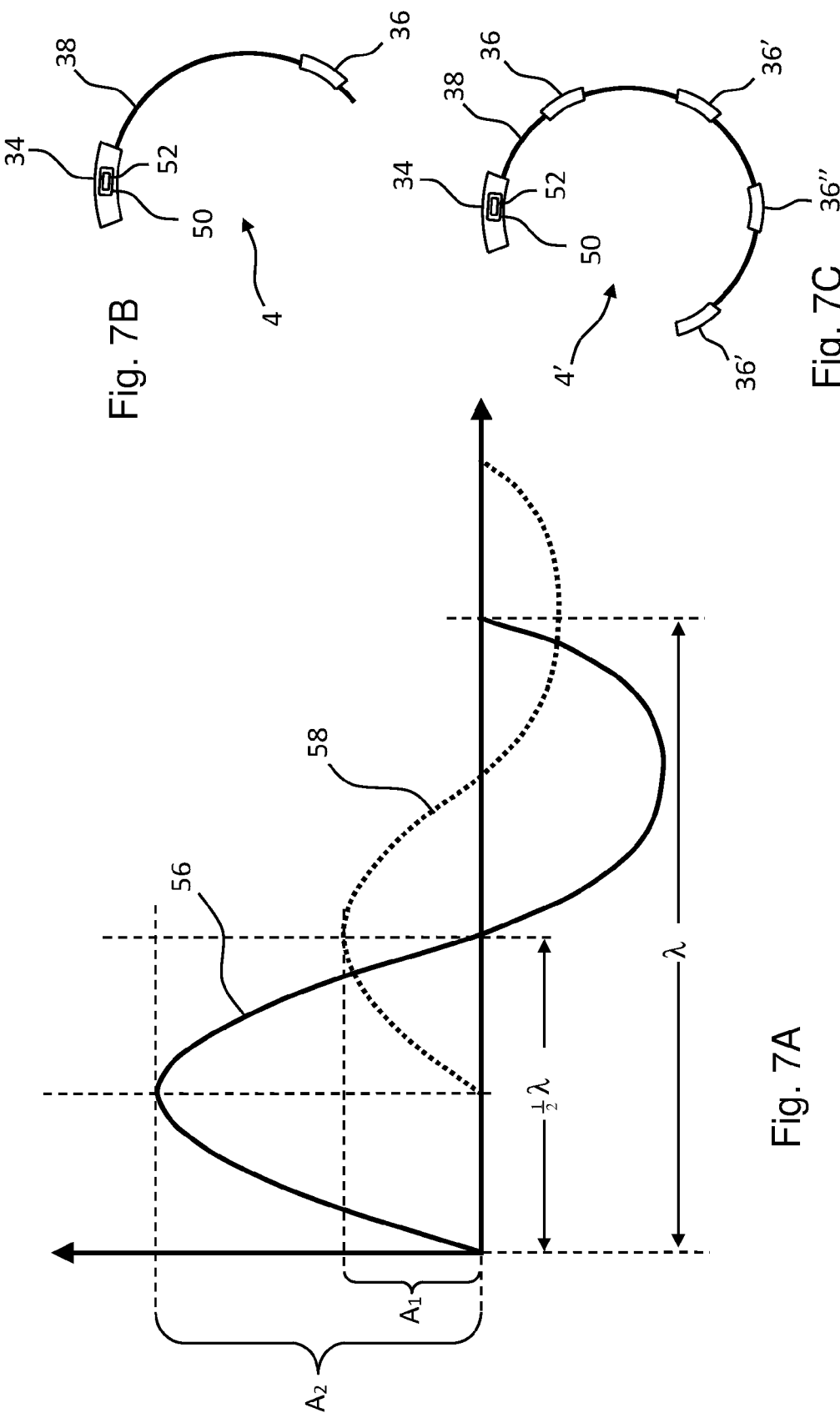
FIG. 7A shows a partial discharge current running in the conductors and the shield, respectively.
FIG. 7B shows a sensor according to an embodiment.
FIG. 7C shows another sensor according to an embodiment.

FIG. 7A illustrates a first curve 56 depicting the current running in the conductors of a power cable such as the one shown in FIG. 5A during a partial discharge event versus time, wherein a sensor corresponding to the one shown in FIG. 4C or in FIG. 6C is used to detect the current. FIG. 7A also illustrates a second dotted curve 58 depicting the current running in the shield of the power cable during the partial discharge event versus time.

The first curve 56 has an amplitude $A_2$ that is larger than the amplitude $A_1$ of the second curve 58. Moreover, the second curve 58 is delayed.

Since the shield is electrically conducting and surrounds the conductors of the power cable (see FIG. 5A), a current is induced in the shield when a current runs in the conductor (s). Due to the capacitive coupling between the conductors and the surrounding shield, the current induced in the shield is delayed by 90 degrees (or a fourth of a wavelength $\lambda$).

Therefore, the second curve 58 (showing induced current in the shield caused by an external partial discharge event current, is delayed 90 degrees when compared with the first curve 56. Accordingly, by comparing the first solid curve 56 and the second dotted curve 58, the order of the partial discharge event currents will reveal if the partial discharge event current is caused by a leakage structure in the power cable. The curves 56, 58 shown in FIG. 7A reveal that the partial discharge event occurred in the conductors of the power cable.

FIG. 7B illustrates a sensor 4 according to an embodiment. The sensor 4 basically corresponds to the sensor shown in FIG. 6A. The main sensor member 34, however, comprises a signal processing unit 50. The signal processing unit 50 applies an algorithm that uses a mathematical model 52 according to an embodiment. In another embodiment, the signal processing unit 50 and the mathematical model 52 may be located in the additional sensor member 36 or in a separate device (not shown) of the sensor 4.

FIG. 7C shows another sensor 4' according to an embodiment. The sensor 4 basically corresponds to the sensor shown in FIG. 4A. The main sensor member 34, however, comprises a signal processing unit 50. The signal processing unit 50 applies an algorithm that uses a mathematical model 52 according to an embodiment. In another embodiment, the signal processing unit 50 and the mathematical model 52 may be located in one of the additional sensor members 36, 36', 36" or in a separate device (not shown) of the sensor 4'.

Figure 8:
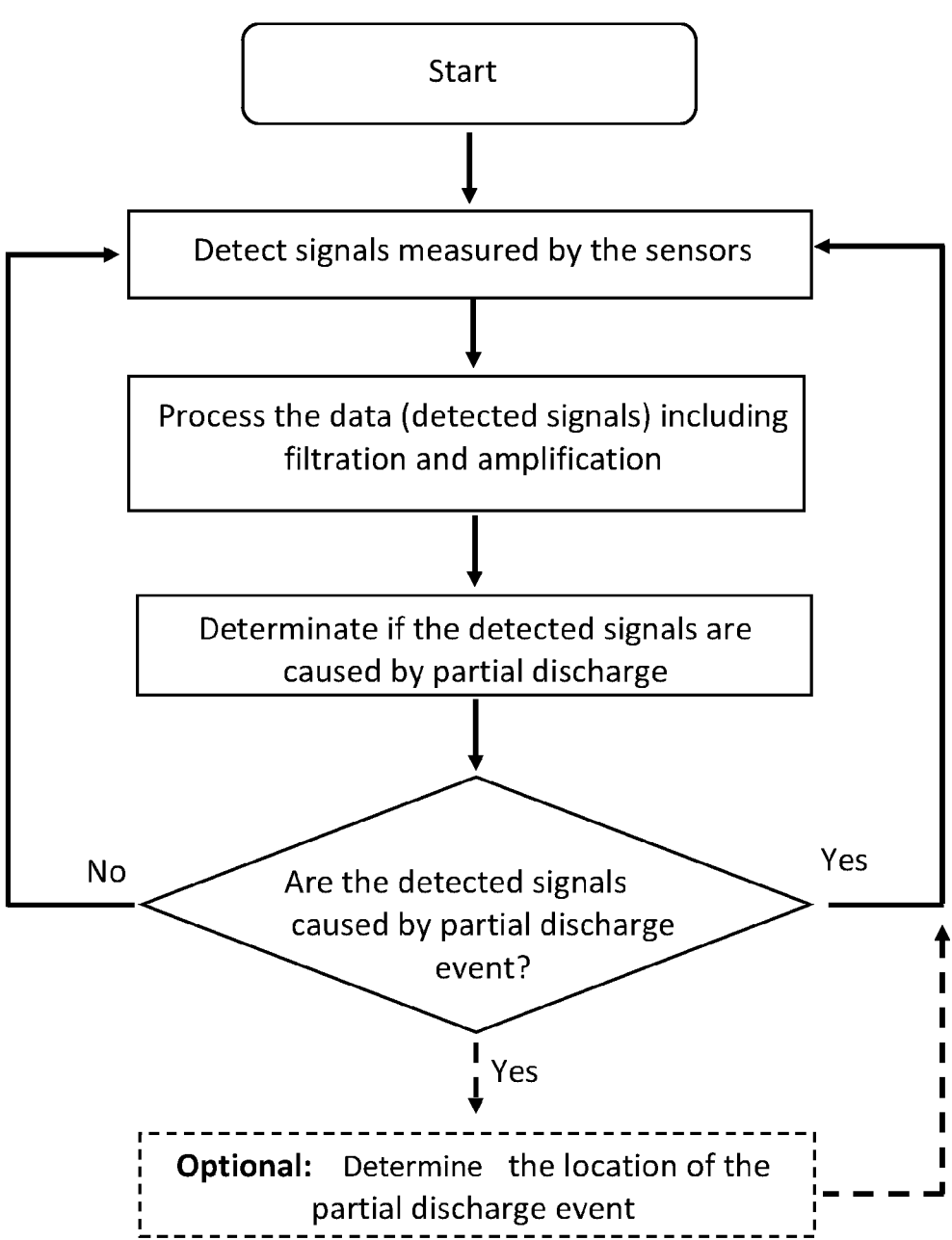
FIG. 8 shows a flow chart illustrating a method according to an embodiment.

FIG. 8 illustrates a flow chart illustrating a method according to an embodiment. The first step of the method is to detect signals measured by the sensors. The sensors will provide different data because the sensors are located in different positions.

The data detected by the sensors is processed. The processing procedure includes filtration using a high pass filter. The processing procedure also includes amplification of the signal.

In the next step, it is determined whether or not the detected signals are caused by partial discharge caused by a damaged power cable (having a leakage structure). This can be accomplished using the processing unit as explained with reference to FIG. 3.

In an embodiment, these steps are repeated over and over in order to continuously monitor the power cable.

In an embodiment, an additional step is carried out. This step includes determination of the location of the partial discharge event. Hereby, it is possible to apply the method according to an embodiment to locate the position of the damaged part of the power cable.

FIG. 9A illustrates a sensor 4 according to an embodiment. The sensor 4 comprises a main sensor member 34 and a plurality of additional sensor members 35, 35', 35", 35''', 36, 36', 36", 36''', 37, 37'. The main sensor member 34 and the additional sensor members 35, 35', 35", 35''', 36, 36', 36", 36''', 37, 37' are mounted in a mounting structure 62. Therefore, the positions of the main sensor member 34 and the additional sensor members 35, 35', 35", 35''', 36, 36', 36", 36''', 37, 37' relative to each other are well-defined and known. This information is applied when using the mathematical model to estimate the transfer functions from the conductors and the screen to the main sensor 34 and the sub-sensors 35, 35', 35", 35''', 36, 36', 36", 36''', 37, 37' as a linear projection and a stochastic noise component. The geometry of the mounting structure 62 may be arced as shown in FIG. 9A. The geometry of the mounting structure 62 may, however, be different. As long as the positions of the main sensor member 34 and the additional sensor members 35, 35', 35", 35''', 36, 36', 36", 36''', 37, 37' relative to each other are well-defined and known. The geometry of the mounting structure 62 may, by way of example be straight so that the main sensor member 34 and the additional sensor members 35, 35', 35", 35''', 36, 36', 36", 36''', 37, 37' are arranged along a straight line.

FIG. 9B illustrates the sensor 4 shown in FIG. 9A attached to a power cable 12 comprising three conductors 16, 18, 20 and an electrically conducting shield 22. The conductors 16, 18, 20 are electrically insulated from each other and surrounded by the electrically conducting shield 22 that is spaced apart from the conductors 16, 18, 20. A shield structure 60 formed as an electric-field shield surrounds the power cable 12 and the sensor 4.

Since the main sensor member 34 and the additional sensor members 35, 35', 35", 35''', 36, 36', 36", 36''', 37, 37' extend along the outer surface of the power cable 12, the distance from the center of the power cable 12 to the main sensor member 34 and the additional sensor members 35, 35', 35", 35''', 36, 36', 36", 36''', 37, 37' is known. In order to identify whether current measurements are caused by a partial discharge event caused by a leakage structure in the power cable 12 or in the electrically conducting shield 22, the systems and methods disclosed herein apply the measurements made by the main sensor member 34 and the additional sensor members 35, 35', 35", 35''', 36, 36', 36", 36''', 37, 37' as well as parameters that are known (the positions of the main sensor member 34 and the additional sensor members 35, 35', 35", 35''', 36, 36', 36", 36''', 37, 37' relative to each other as well as the diameter of the power cable 12). By arranging the main sensor member 34 and the additional sensor members 35, 35', 35", 35''', 36, 36', 36", 36''', 37, 37' in a predefined mounting structure 62, the positions of the main sensor member 34 and the additional sensor members 35, 35', 35", 35''', 36, 36', 36", 36''', 37, 37' relative to each other will be known.

By providing a sufficiently large number of additional sensor members 35, 35', 35", 35''', 36, 36', 36", 36''', 37, 37', it is possible to provide enough measurements and thus a sufficiently large number of equations to solve the system of equations and thus determine the current that is flowing in the conductors and the current flowing in the electrically conducting shield 22.

FIG. 9C illustrates a sensor 4 according to an embodiment clamped onto the outside of a power cable comprising three conductors 16, 18, 20 and an electrically conducting shield 22. The conductors 16, 18, 20 are electrically insulated from each other and surrounded by the electrically conducting shield 22 that is spaced apart from the conductors 16, 18, 20.

The sensor 4 comprises a main sensor member 34 and several additional sensor members 35, 35', 35", 35''', 36, 36', 36", 36''', 37, 37' that are arranged in a predefined manner relative to each other and are attached to a power cable.

Accordingly, the distance from the center of the power cable to the main sensor member 34 and the additional sensor members 35, 35', 35", 35''', 36, 36', 36", 36''', 37, 37' is known. Accordingly, it is possible to identify whether current measurements are caused by a partial discharge event caused by a leakage structure in the power cable or in the electrically conducting shield, using the same principles as explained with reference to FIG. 9B.

FIG. 9D illustrates another sensor 4 according to an embodiment clamped onto the outside of a power cable corresponding to the one shown in FIG. 9C. The sensor 4 comprises a main sensor member 34 and a plurality of additional sensor members 35, 35', 35", 35''', 36, 36', 36", 36''', 37, 37', 37" that are arranged along the outer surface of the power cable. Therefore, the main sensor member 34 and the additional sensor members 35, 35', 35", 35''', 36, 36', 36", 36''', 37, 37', 37" are arranged in a predefined manner relative to each other. Accordingly, the distance from the center of the power cable to the main sensor member 34 and the additional sensor members 35, 35', 35", 35''', 36, 36', 36", 36''', 37, 37' is known. Accordingly, it is possible to identify whether current measurements are caused by a partial discharge event caused by a leakage structure in the power cable or in the electrically conducting shield, using the same principles as explained with reference to FIG. 9B and FIG. 9C.

FIG. 10A illustrates a sensor 4 according to an embodiment arranged at the outside surface of a power cable that comprises three conductors and an electrically conducting shield. The conductors are electrically insulated from each other and surrounded by the electrically conducting shield that is spaced apart from the conductors.

The sensor 4 comprises a main sensor member 34 and several additional sensor members 35, 35', 35", 35''', 36, 36', 36" that are arranged in a predefined manner (along the cylindrical surface of the power cable) and attached to the power cable. The main sensor member 34 and the additional sensor members 35, 35', 35", 35''', 36, 36', 36" are arranged along a plane that extends perpendicular to the longitudinal axis X of the power cable. Therefore, the distance from the center of the power cable to the main sensor member 34 and the additional sensor members 35, 35', 35", 35''', 36, 36', 36" is known.

Therefore, it is possible to identify whether current measurements are caused by a partial discharge event caused by a leakage structure in the power cable or in the electrically conducting shield, using the same principles as explained with reference to FIG. 9B and FIG. 9D.

FIG. 10B illustrates another sensor 4 according to an embodiment arranged at the outside surface of a power cable comprising three conductors and an electrically conducting shield. The power cable corresponds to the one shown in FIG. 10A.

The sensor 4 comprises a main sensor member 34 and several additional sensor members 35, 35', 35", 35''', 36, 36', 36" that are arranged in a predefined manner along the surface of the power cable and attached to the power cable. The main sensor member 34 and the additional sensor members 35, 35', 35", 35''', 36, 36', 36" are arranged along a plane that is angled with an angle α (different from 90 degrees) relative to the longitudinal axis X of the power cable. If the angle α is not known, it will still be possible to use the method to identify whether the current measurements are caused by a partial discharge event caused by a leakage structure in the power cable or in the electrically conducting shield. The distance from the center of the power cable to the main sensor member 34 and the additional sensor members 35, 35', 35", 35''', 36, 36', 36" is known. Thus, is possible to identify whether current measurements are caused by a partial discharge event caused by a leakage structure in the power cable or in the electrically conducting shield, using the same principles as explained with reference to FIG. 9B and FIG. 9D.

FIG. 10C illustrates a sensor 4 according to an embodiment arranged at the outside surface of a multiconductor power cable corresponding to the one shown in FIG. 9C and in FIG. 9D. The sensor 4 basically corresponds to the one shown in FIG. 9D.

FIG. 10D illustrates how the method can be used in a manner in which the conductors of a multiconductor cable, such as the one shown in FIG. 10C, can be treated as a single estimated conductor 21. This is possible since the flow of currents through the conductors of a multiconductor cable is zero.

LIST OF REFERENCE NUMERALS

2 (Partial discharge analysis) system
4, 4', 4", 4'''(Partial discharge) sensor
6, 6', 6", 6''', 6'''' Partial discharge signal
8 Power station
10 Partial discharge event
12 Power cable (e.g. a multicore)
14 Lightning
16, 18, 20 Single conductor of a power cable
21 Estimated conductor
22 Metallic lead shield
24 Communication unit
26 Cloud (server that is accessed over the Internet)
28 Antenna
30 Transmitted signal
32 Ground level
34 Main sensor member
35, 35', 35", 35''' Additional sensor member
36, 36', 36", 36''' Additional sensor member
37, 37', 37" Additional sensor member
38 Connector
40 Filler
42 Insulator
44 Insulation structure
46 Leakage structure
48 Fused region
50 Processing unit
52 Mathematical model
54, 54' Curve
56, 58 Curve
60 Shield structure
62 Mounting structure
$A_1, A_2$ Amplitude
$\alpha$ Angle
$\lambda$ Wavelength
B Magnetic field line
X Longitudinal axis
What is claimed is:

1. A system for detecting insulation defects in an underground power cable, having at least one conductor and being surrounded by an electrically conducting shield, the system comprising:

two or more sensors clamped onto an outside of or arranged in a proximity of the underground power cable, wherein the two or more sensors are configured to provide one or more current measurements from the outside of the underground power cable without being electrically connected to the at least one conductor of the underground power cable; and a signal processing unit adapted to use a mathematical statistical model that processes measurements made by the two or more sensors to identify if the one or more current measurements are caused by a partial discharge event from a leakage structure in the underground power cable, the mathematical statistical model configured to make a linear projection of a current in the at least one conductor and the electrically conducting shield, wherein the mathematical statistical model is defined as:

$$Y_t = F_t(\theta_t) + \varepsilon_t, \; \varepsilon_t \sim \delta_1(V_t)$$

$$\theta_t = g_t(\theta_{t-1}) + \vartheta_t, \; \vartheta_t \sim \delta_2(W_t)$$

where $Y_t$ is a vector determining an observed process at time t comprising observed data from the two or more sensors;

$\theta_t$ is a vector determining a latent stochastic process at time t comprising latent process data;

$F_t$ is a regression matrix which determines a linear relation between the latent stochastic process and the observed process at time t;

$g_t$ is an evolve matrix which determines a transition from time t–1 to time t in the latent stochastic process;

$\delta_1$ and $\delta_2$ are stochastic noise vectors of the observed process and the latent stochastic process respectively;

$\varepsilon_t$ and $\vartheta_t$ are zero mean multivariate Gaussian distributed noise vectors of the observed process and the latent stochastic process respectively;

$V_t$ is an observation variance-covariance matrix; and $W_t$ is an evolution variance-covariance matrix.

2. The system according to claim 1, wherein the underground power cable comprises at least two conductors.

3. The system according to claim 1, wherein the two or more sensors are spaced apart along a length of the electrically conducting shield of the underground power cable.

4. The system according to claim 1, wherein the two or more sensors comprise a main sensor member and one or more additional sensor members arranged around a circumference of the electrically conducting shield of the underground power cable, wherein the main sensor member and the one or more additional sensor members are tangentially spaced apart.

5. The system according to claim 1, further comprising a calibration unit configured to carry out a calibration of the two or more sensors based on physical placement on the underground power cable and environment.

6. The system according to claim 5, wherein the calibration unit is physically separated from the two or more sensors.

7. The system according to claim 5, wherein the calibration unit is integrated in each of the two or more sensors.

8. The system according to claim 5, wherein the calibration unit is configured to calibrate the two or more sensors upon movement of a main sensor member and several additional sensor members of the two or more sensors along a periphery of the underground power cable.

9. The system according to claim 1, wherein the two or more sensors comprise an energy harvester.

10. The system according to claim 9, wherein the energy harvester comprises a thermoelectric generator or an electric-field energy harvesting device.

11. The system according to claim 1, further comprising:

a communication unit extending from at least one of the two or more sensors towards ground level; and an antenna configured to transmit wireless signals;

wherein the communication unit and the antenna cooperate to wirelessly transmit measurements made by the two or more sensors.

12. The system according to claim 1, further comprising a shield structure surrounding the two or more sensors and an entire circumference of the underground power cable where the two or more sensors are positioned, wherein the shield structure is an electromagnetic field shield.

13. The system according to claim 1, wherein the processing unit comprises a peak detector configured to analyze the one or more current measurements and detect any current peaks.

14. The system according to claim 1, wherein the processing unit comprises a high pass filter configured to high pass filter the one or more current measurements.

15. The system according to claim 1, wherein the processing unit comprises an algorithm configured to automatically identify if the one or more current measurements are caused by a partial discharge event from a leakage structure in the underground power cable.

16. A method for detecting insulation defects in an underground power cable, having at least one conductor and being surrounded by an electrically conducting shield, the method comprising:

clamping two or more sensors onto an outside of the underground power cable or arranging the two or more sensors in a proximity of the underground power cable, wherein the two or more sensors provide one or more current measurements from the outside of the underground power cable without being electrically connected to the at least one conductor of the underground power cable;

applying a signal processing unit to process data using a mathematical statistical model which processes measurements made by the two or more sensors to identify if the one or more current measurements are caused by a partial discharge event from a leakage structure in the underground power cable, wherein the mathematical statistical model is used to make a linear projection of current in the at least one conductor and the electrically conducting shield, wherein the mathematical statistical model is defined as:

$$Y_t = F_t(\theta_t) + \varepsilon_t \; \varepsilon_t \sim \delta_1(V_t)$$

$$\theta_t = g_t(\theta_{t-1}) + \vartheta_t \; \vartheta_t \sim \delta_2(W_t)$$

where $Y_t$ is a vector determining an observed process at time t comprising observed data from the two or more sensors;

$\theta_t$ is a vector determining a latent stochastic process at time t comprising latent process data;

$F_t$ is a regression matrix which determines a linear relation between the latent stochastic process and the observed process at time t;

$g_t$ is an evolve matrix which determines a transition from time t−1 to time t in the latent stochastic process;

$\delta_1$ and $\delta_2$ are stochastic noise vectors of the observed process and the latent stochastic process respectively;

$\varepsilon_t$ and $\vartheta_t$ are zero mean multivariate Gaussian distributed noise vectors of the observed process and the latent stochastic process respectively;

$V_t$ is an observation variance-covariance matrix; and $W_t$ is an evolution variance-covariance matrix.

17. The method according to claim 16, wherein the underground power cable comprises two or more conductors.

18. The method according to claim 16, further comprising establishing a connection between each of the two or more sensors and the signal processing unit.

19. The method according to claim 16, further comprising a step of calibrating the two or more sensors.

20. The method according to claim 16, further comprising arranging a main sensor member and one or more additional sensor members of the two or more sensors around a circumference of the electrically conducting shield of the underground power cable such that the main sensor member and the one or more additional sensor members are tangentially spaced apart.

* * * * *